United States Patent [19]

Minagawa et al.

[11] 4,398,114

[45] Aug. 9, 1983

[54] SURFACE-ACOUSTIC-WAVE PARAMETRIC DEVICE

[75] Inventors: Shoichi Minagawa; Takeshi Okamoto, both of Toda, Japan

[73] Assignee: Clarion Co., Ltd., Tokyo, Japan

[21] Appl. No.: 218,379

[22] Filed: Dec. 19, 1980

[30] Foreign Application Priority Data

Dec. 24, 1979 [JP] Japan .................. 54-166928
Dec. 26, 1979 [JP] Japan .................. 54-168089

[51] Int. Cl.³ .................. H03H 9/64; H01L 27/20
[52] U.S. Cl. .................. 310/313 R; 310/334; 333/195
[58] Field of Search .......... 310/313 R, 313 A, 313 B, 310/313 C, 313 D, 320, 322, 325, 334; 333/149–155, 194, 195; 330/4.5, 5.5; 357/10, 26

[56] References Cited

U.S. PATENT DOCUMENTS 3,827,002  7/1974  Chao .................. 310/313 A
4,288,765  9/1981  Mikoshiba et al. .......... 333/195

*Primary Examiner*—William M. Shoop
*Assistant Examiner*—Peter S. Wong
*Attorney, Agent, or Firm*—Flynn, Thiel, Boutell & Tanis

[57] ABSTRACT

A surface-acoustic-wave parametric device includes in that a plurality of pumping electrodes arranged along a propagation path of surface acoustic wave. Values of DC bias voltages to be applied to the respective pumping electrodes for forming parametric interaction regions, or values of pumping voltages to be applied to the pumping electrodes, are differentiated so as to correspond to a desired frequency characteristic.

19 Claims, 29 Drawing Figures

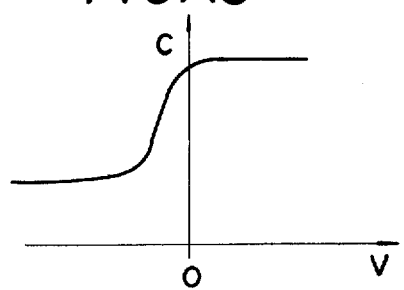
FIG. 13
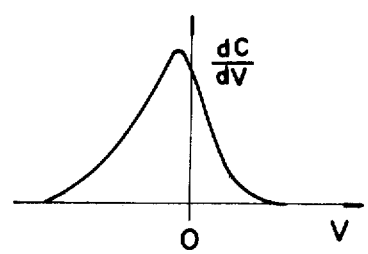
FIG. 14
FIG. 15
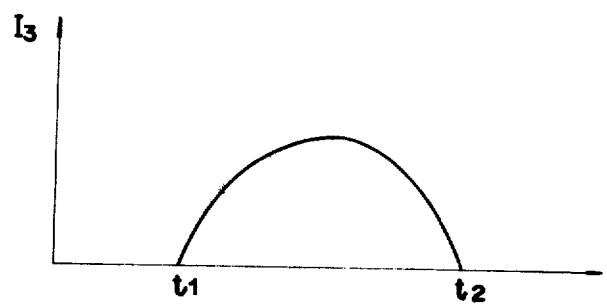
FIG. 16
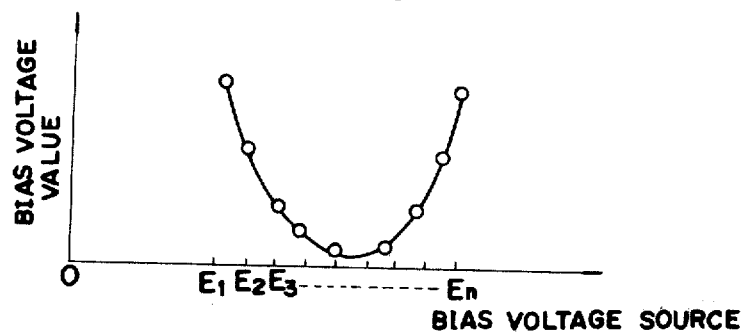
FIG. 17
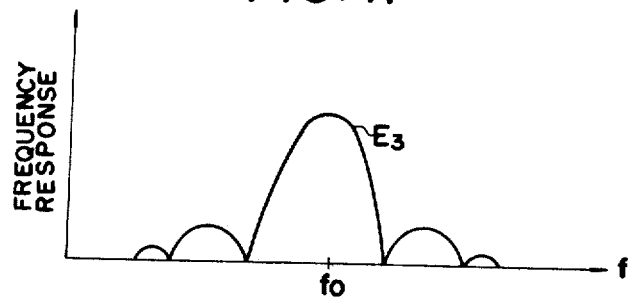

SURFACE-ACOUSTIC-WAVE PARAMETRIC DEVICE

BACKGROUND OF THE INVENTION

1. Field of the Invention

This invention relates to a surface-acoustic-wave parametric device for use as a variable-frequency selecting device. More particularly, this invention relates to a surface-acoustic-wave parametric device wherein a plurality of pumping electrodes are arranged in the direction of propagation of surface acoustic waves, and values of DC bias voltages or pumping voltages for forming parametric interaction regions, which are to be applied to the respective pumping electrodes, are differentiated from each other so as to correspond to a desired output frequency characteristic, thereby enabling desired design of a frequency characteristic of the variable-frequency selecting device.

2. Description of the Prior Art

One of the inventors of the present invention has already disclosed, in Japanese Laying-Open No. 54-41089 (1979), a surface-acoustic-wave device having a variable frequency selecting function as illustrated in FIG. 1.

In FIG. 1, numeral 1 designates a semiconductor substrate, and an insulator film 2 and a piezoelectric layer 3 are laminated on the semiconductor substrate 1. A rectangular pumping electrode 4 to which a DC bias voltage and a pumping voltage are applied and input and output transducers 5 and 6 are arranged on the piezoelectric layer 3.

Numeral 7 designates a DC power source for applying a DC bias voltage, 8 designates an inductor for AC blocking, 9 designates a high-frequency power source for applying a pumping voltage, 10 is a capacitor for DC blocking, and 11 and 12 designate surface-acoustic-wave absorbing members for preventing undesired reflection of surface acoustic waves at the ends of the device.

The DC bias voltage is applied from the DC power source 7 to the pumping electrode 4 so as to create a suitable depletion-layer capacitance at a surface portion of the semiconductor substrate 1 under the pumping electrode 4. Further, the pumping voltage having a frequency which is twice that of a center frequency fo of a desired frequency band is applied from the high-frequency power source 9 to the pumping electrode 4 so that the depletion layer capacitance is oscillated and modulated at the frequency 2fo.

When an electric signal is applied to the broad-band input transducer 5, the input electric signal is converted into a surface-acoustic-wave signal which is propagated on the surface of the piezoelectric layer 3 rightwardly and leftwardly as viewed in FIG. 1.

When a signal component of the surface-acoustic-wave input signal 13 propagating in the rightward direction and having a frequency around fo passes through an operating region under the pumping electrode 4, the piezoelectric potential thereof is subjected to a parametric interaction with the pumping voltage due to the depletion layer capacitance non-linearity effect on the surface of the semiconductor substrate 1 so that the component is amplified. This amplified surface-acoustic-wave signal 14 is converted into and outputted in the form of an electric signal by the output transducer 6.

At the same time, a surface-acoustic-wave signal 15, which has a frequency fi (fi = 2fo − fs, fs: a frequency of the input signal) corresponding to the amplitude of the surface-acoustic-wave input signal 13, is also produced from the pumping electrode 4 and propagated leftwardly as viewed in FIG. 1. This surface-acoustic-wave signal 15 may also be outputted as an output signal.

The frequency characteristics 14a, 15a, 14b and 15b of the respective output surface-acoustic-wave signals 14 and 15 are shown, in FIGS. 2 and 3, in relation with the input signal 13 whose amplitude is shown as 1 in the figures. FIG. 2 shows the case where the pumping voltage is relatively small and FIG. 3 shows the case where the pumping voltage is relatively large.

As apparent from FIGS. 2 and 3, in the surface-acoustic-wave device having a rectangular pumping electrode, a response at a signal passing band and a spurious response are substantially determined when an output at a desired center frequency fo is selected. By this reason, when the conventional surface-acoustic-wave device is used as a frequency selecting device, the frequency characteristic cannot be designed freely. And yet, the spurious response is still too high to be practically used.

OBJECT OF THE INVENTION

It is therefore an object of the present invention to provide a surface-acoustic-wave parametric device which is capable of obviating the disadvantages involved in the conventional device.

It is another, more specific object of the present invention to provide a surface-acoustic-wave parametric device which is capable of adapting the response in a signal passing band for a desired specification and reducing the spurious response to an extent negligible in a practical use.

SUMMARY OF THE INVENTION

In accordance with the present invention, there is provided a surface-acoustic-wave parametric device which comprises:

a laminate formed of a semiconductor layer and a piezoelectric layer;

a plurality of pumping electrodes provided on a surface-acoustic-wave propagating path in said laminate;

means for applying pumping voltages to the respective pumping electrodes; and means for applying DC bias voltages of different values to the respective pumping electrodes so as to correspond to a desired frequency characteristic of an output surface acoustic wave.

BRIEF DESCRIPTION OF THE DRAWINGS

FIG. 2 showing the case in which a pumping voltage is relatively small and FIG. 3 showing the case in which the pumping voltage is relatively large;

FIG. 13 is a characteristic curve showing a bias voltage dependency of a capacitance developed in a direction from the pumping electrodes to the entire device;

FIG. 14 is a characteristic curve showing a characteristic dC/dV wherein the characteristic of FIG. 13 is further differentiated;

FIG. 15 is a characteristic curve showing the impulse response of the characteristic of FIG. 12 with the waveform portion other than $-\pi < x < \pi$ removed;

FIG. 16 is a curve showing an example of an arrangement of DC bias voltages to be applied to the respective pumping electrodes and corresponding to the impulse response of FIG. 15;

FIG. 17 is a characteristic curve of one example of an output frequency characteristic obtained when the arrangement of FIG. 16 is applied to the device of FIG. 8;

THEORY OF THE INVENTION

According to a common electric circuit theory, an output frequency characteristic of a linear circuit can be obtained by a Fourier-transform of time response (time change) at an output when an impulse is applied to an input.

Therefore, if the time response related by Fourier-transform with a desired frequency characteristic is first obtained and the linear circuit is then designed so that the time response may be equal to the impulse response, there can be obtained an output signal having the desired frequency characteristic.

This theory will now be described in more detail in connection with its application to the conventional device of FIG. 1, referring to FIGS. 4A to 7B.

Figure 1:
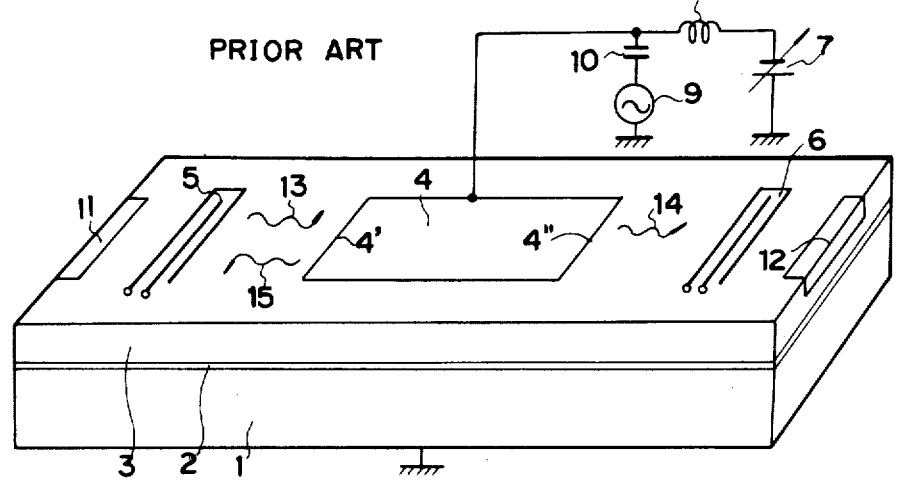
FIG. 1 is a perspective view of a conventional surface-acoustic-wave device.
Figures 4A, 4B, 5A, 5B:
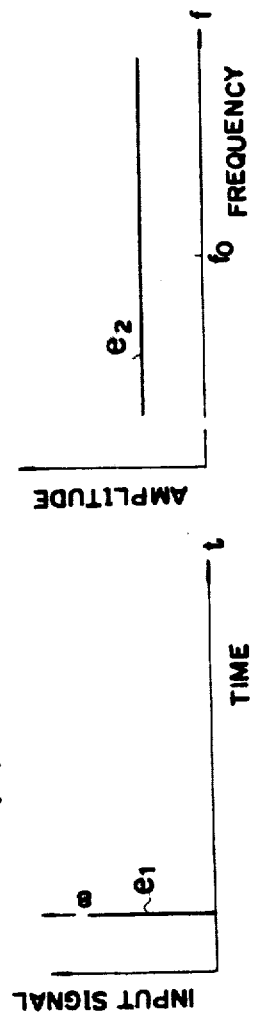
FIG. 4A is a waveform diagram showing an ideal impulse used for the design of parametric interaction regions.
FIG. 4B is a characteristic curve showing one example of a time response when the ideal impulse of FIG. 4A is applied to the device of FIG. 1.
FIG. 5A is a frequency characteristic curve of an ideal input surface acoustic wave.
FIG. 5B is a characteristic curve showing a frequency spectrum of backward surface-acoustic-wave output when the ideal input surface acoustic wave of FIG. 5A is applied to the device of FIG. 1.

In the surface-acoustic-wave parametric device as illustrated in FIG. 1, the parametric interaction is set to be not so large, and an ideal impulse $e_1$ having a duration of 0 as shown in FIG. 4A is inputted to the input transducer 5 for time $t=0$. The time response $I_1$ *of an output signal 15 (having a frequency fi) of the resultant two surface-acoustic-wave signals outputted rightwardly and leftwardly from the pumping electrode 4, which travels in a direction opposite to that of the input surface acoustic wave 13, is as shown in FIG. 4B. In FIG. 4B, time $t_1$ is the time required for the surface-acoustic-wave signal to reciprocate between the input transducer 5 and a near end 4' of the pumping electrode 4, and time $t_2$ is the time required for the surface-acoustic-wave signal to reciprocate between the input transducer 5 and a remote end 4" of the pumping electrode 4.

The input impulse $e_1$ and the output time response $I_1$ will be described in more detail. The ideal impulse $e_1$ contains infinite frequency components. When this impulse $e_1$ is inputted through the input transducer 5, only the signal components, among the infinite signal components, which have a frequency around fo (when the pumping frequency is 2fo) are subjected to a parametric interaction and outputted as the backward surface-acoustic-wave signal 15 which travels oppositely to the input surface-acoustic-wave signal 13. The envelope obtained by AM-demodulating the frequency components of the output signal is shown in FIG. 4B in the form of the output time response $I_1$.

When a signal $e_2$ having a constant amplitude and including a frequency fo as shown in FIG. 5A is applied, instead of the impulse $e_1$, to the input transducer 5, the backward surface-acoustic-wave output signal 15 has a frequency spectrum 15c as shown in FIG. 5B. The frequency spectrum 15c of FIG. 5B corresponds to the output frequency characteristic shown by 15a in FIG. 2.

The frequency spectrum 15c corresponds to a result of a Fourier-transform of the time response $I_1$.

Now, assuming that the frequency spectrum 15c shown in FIG. 5B is the desired frequency characteristic, it is the time response $I_1$ of FIG. 4B that is related by Fourier Transform with the desired characteristic, and the linear circuit presenting the time response $I_1$, i.e., the surface-acoustic-wave parametric device, is the device having the rectangular pumping electrode 4 as illustrated in FIG. 1.

Figure 6A:
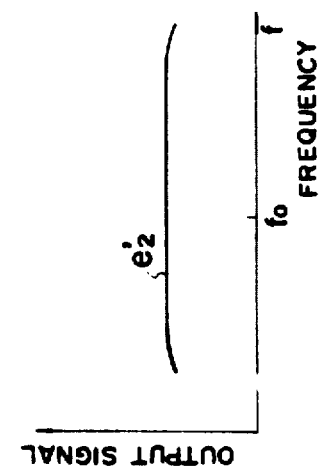
FIG. 6A is a waveform diagram of one example of a RF pulse practically employed instead of the ideal impulse of FIG. 4A.

However, the ideal impulse as described above is, in fact, impracticable. Therefore, a RF pulse $e_1'$ having a carrier frequency fo and a duration $t(t<<t_2-t_1)$ as shown in FIG. 6A is employed.

Figure 6B:
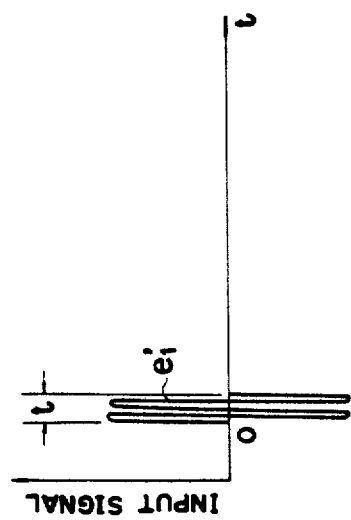
FIG. 6B is a characteristic curve showing one example of time response when the RF pulse of FIG. 6A is applied to the device of FIG. 1.

In this case, the time response $I_1'$ of the backward output signal 15 is as shown in FIG. 6B. When the time response $I_1'$ is subjected to AM demodulation, the obtained envelope is substantially the same as that shown in FIG. 4B. The carrier frequency of the time response output signal $I_1'$ shown in FIG. 6B is fi=2fo−fo=fo.

As compared with the signal $e_2$ having a constant amplitude as shown in FIG. 5A, an actual signal $e_2'$ has an amplitude-attenuation tendency at frequency portions remote from a center frequency fo.

Figure 7A:
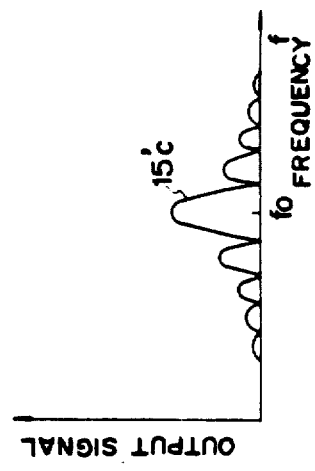
FIG. 7A is a frequency characteristic curve of an input surface acoustic wave practically employed instead of the ideal input surface acoustic wave of FIG. 5A.
Figure 7B:
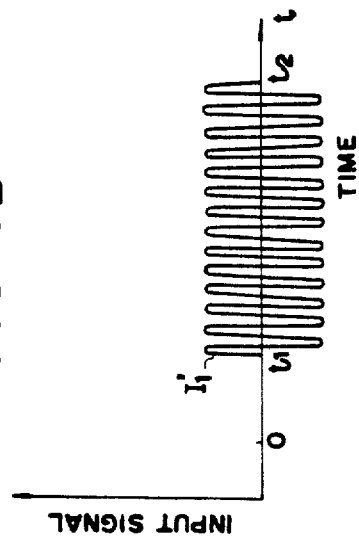
FIG. 7B is a characteristic curve showing a frequency spectrum of backward surface-acoustic-wave output when the input surface acoustic wave of FIG. 7A is applied to the device of FIG. 1.

However, when such a signal $e_2'$ is inputted through the transducer 5, a frequency spectrum 15c' of a resultant backward output signal is similar to that shown in FIG. 7B. The frequency spectrum 15c' is substantially the same as that shown in FIG. 5B.

Practically, in designing a surface-acoustic-wave parametric device according to the desired frequency characteristic (designing regions for parametric interaction), signals having the constant amplitude as shown in FIGS. 6A and 7A are employed.

DESCRIPTION OF THE EMBODIMENTS

The invention achieved based on the technique as described above will now be described in detail, referring to the embodiment illustrated in from FIG. 8 on.

In these figures, parts the same as or similar to those in FIG. 1 are indicated by the same or similar numerals.

Figure 8:
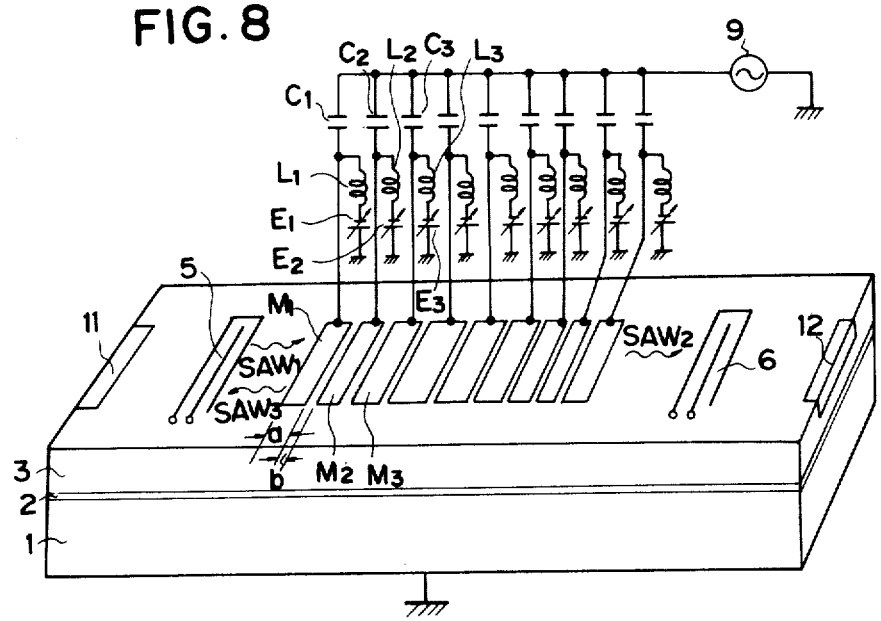
FIG. 8 is a schematic view of one form of surface-acoustic-wave parametric device embodying the present invention, showing a laminate thereof in perspective.

In FIG. 8, 1 is a semiconductor substrate made, for example, of silicon (Si). An insulator film 2 and a piezoelectric layer 3 are laid on the semiconductor substrate 1 in that order, to form a laminate.

The insulator film 2 is used for surface passivation of the semiconductor substrate 1 and is formed, for example, of silicon dioxide ($SiO_2$). The piezoelectric layer 3 is formed of a piezoelectric material such as zinc oxide (ZnO), aluminum nitride (AlN), etc.

An input transducer 5 and an output transducer 6 are disposed on the laminate at positions near the opposite ends of the laminate, respectively. These input and output transducers 5 and 6 are adapted so as to have a sufficiently broad band characteristic.

On a propagation path for a surface acoustic wave between the input transducer 5 and the output transducer 6, a plurality of pumping electrodes $M_1, M_2 \ldots$ are disposed.

The shapes or configurations of the pumping electrodes $M_1, M_2 \ldots$ are, for example, rectangular. The pumping electrodes $M_1, M_2$ are arranged, with the respective long sides disposed parallel with each other, along the propagation direction of the surface acoustic wave. The number of the pumping electrodes, the dimensions such as a width a of each of the electrodes in the direction of the propagation of the surface acoustic wave, and the space b between the respective pumping electrodes $M_1, M_2 \ldots$ are suitably selected, in relation with DC bias voltage values to be applied to the respective electrodes as will be described later, so as to correspond to the desired frequency characteristic.

DC power sources $E_1, E_2, E_3 \ldots$ for applying DC bias voltages are connected to the respective pumping electrodes $M_1, M_2 \ldots$ through respective inductors $L_1, L_2 \ldots$ for blocking AC signals. These DC power sources $E_1, E_2, E_3 \ldots$ are variable power sources and adapted to apply different values of DC bias voltages to the pumping electrodes $M_1, M_2, M_3 \ldots$, respectively. The pumping electrodes $M_1, M_2 \ldots$ are connected to a pumping voltage applying high-frequency power source 9 common to the pumping electrodes through respective DC current blocking capacitors $C_1, C_2, C_3 \ldots$ Numerals 11 and 12 indicate surface-acoustic-wave absorbing members for preventing undesired reflection of surface acoustic wave at the ends of the device.

Figure 9:
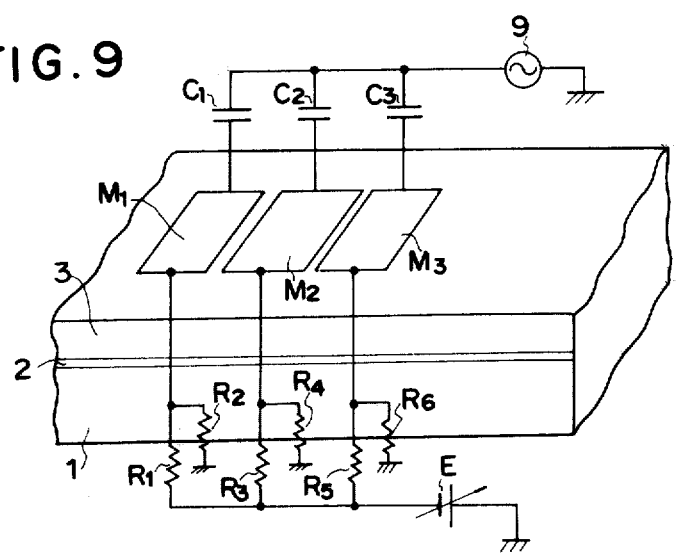
FIG. 9 is a fragmentary perspective view showing a modified arrangement of DC power sources.

To apply different values of DC bias voltages to the pumping electrodes $M_1, M_2, M_3 \ldots$, respectively, a single DC power source E may be used which is common to the respective electrodes as illustrated in FIG. 9. In this case, the DC power source E is connected to the pumping electrodes $M_1, M_2, M_3 \ldots$ through respective voltage regulating means, each formed of a resistor circuit.

Figure 10:
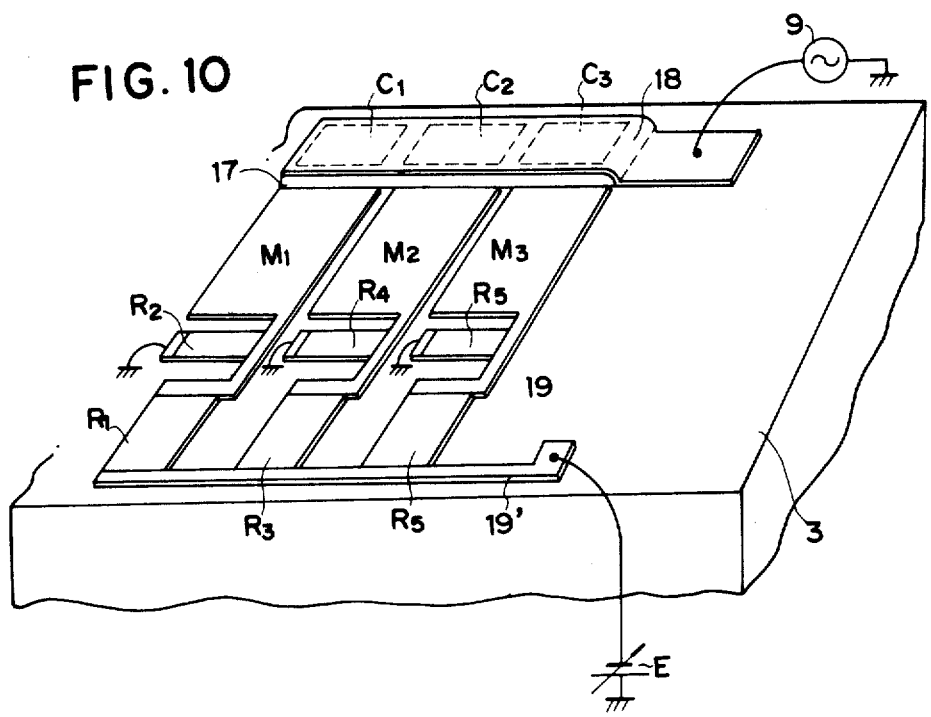
FIG. 10 is an enlarged perspective view, partially omitted, of one example of the arrangement of FIG. 9, wherein resistors etc. are formed in a hybrid integrated circuit.

The voltage regulating means are each formed, for example, of a voltage dividing circuit which is formed of a combination of two resistors, such as $R_1$ and $R_2$, $R_3$ and $R_4$, $R_5$ and $R_6 \ldots$ To provide the voltage regulating means formed of the resistor circuits, respectively, there may be employed, for example, a formation of FIG. 10, which will facilitate of fabrication of the entire device.

More specifically, each of the resistors $R_1, R_2, R_3 \ldots$ is formed of a thin film resistor. The thin film resistors are provided on the piezoelectric layer 3, i.e., in the same plane as where the pumping electrodes $M_1, M_2, M_3$ are disposed, to form a hybrid integrated circuit. In the embodiment illustrated in FIG. 10, the DC blocking capacitors $C_1, C_2, C_3 \ldots$ are provided by integrally forming a hybrid integrated circuit on the respective pumping electrode $M_1, M_2, M_3$, using an inductive thin film 17 and an upper electrodes 18.

Procedures to arrange parametric interaction regions, or set DC bias voltage values to be applied to the respective pumping electrodes $M_1, M_2 \ldots$ will now be described, referring to the technique as given above.

Figure 11:
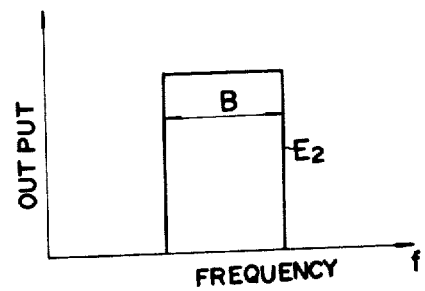
FIG. 11 is a characteristic curve showing a frequency characteristic of an ideal band pass filter.
Figure 12:
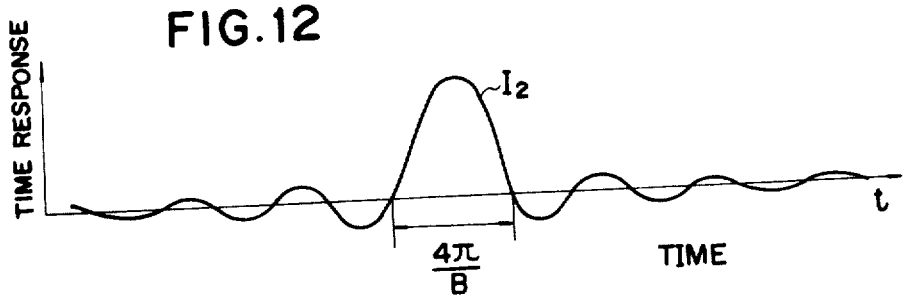
FIG. 12 is a characteristic curve showing the time response related by-o Fourier transform with the frequency characteristic of FIG. 11.

It is now assumed that a desired frequency characteristic is a frequency characteristic $E_2$ of an ideal bandpass filter having a band width B as shown in FIG. 11. When the time response $I_2$ related by Fourier transform with this frequency characteristic $E_2$ is obtained, it is in the form of sin x/x and infinitely extends laterally as shown in FIG. 12.

In this connection, it is to be noted that the amplitude of a surface-acoustic-wave output signal $SAW_3$ produced by an impulse $e_1$ is related to the strength of the parametric interaction region, and a major factor for determining the strength of the parametric interaction region is the extent of non-linearity of the depletion layer capacitance at the semiconductor surface. The extent of the non-linearity varies largely depending upon the DC bias voltage to be applied to each of the pumping electrodes.

This is shown in FIG. 14 with respect to n-type semiconductor substrate. In the figure, the dependency (FIG. 13) on the bias voltage V, of a capacitance C developed in the direction from the pumping electrode to the laminate of the device is differentiated (dC/dV). When the parametric interaction is relatively weak, a square of the magnitude of dC/dV shown in FIG. 14 is substantially in proportion to impulse response. More specifically, in the figure, the magnitude of the impulse response is reduced as the bias voltage is increased when considered in relation only with the forward bias voltage.

To make the time response $I_2$ equal to the impulse response, the values of the DC bias voltages to be applied to the respective pumping electrodes $M_1$, $M_2$, $M_3$ may be differentiated corresponding to the waveforms of the tme response.

To correspond exactly to the ideal bandpass filter (FIG. 11), an infinite number of pumping electrodes $M_1$, $M_2$, $M_2$ . . . must be provided and arranged like the waveform $I_2$ of FIG. 12 to cause parametric interaction regions. Therefore, the size of the laminate becomes infinitely large, which is not practicable.

For these reasons, a filter characteristic (frequency selecting characteristic) may be deteriorated in so far as it will not cause problems in practical use, but the number of the pumping electrodes and the values of the DC bias voltages are selected so as to attain the optimum characteristic within the restriction.

An example of design of practical parametric interaction regions, namely, the number of the pumping electrodes and the values of the DC bias voltages to be applied to the electrodes, respectively, will now be described.

FIG. 15 an impulse response $I_3$ corresponding to a time response which corresponds to the time response of sin x/x of FIG. 12 with waveform portions other than $-\pi < x < \pi$ removed. The values of the DC bias voltages to be applied to the respective pumping electrodes $M_1$, $M_2$, $M_3$ . . . so as to correspond to the impulse response $I_3$ are as shown in FIG. 16. As indicated in FIG. 8, $E_1$, $E_2$, $E_3$ . . . $E_n$ are DC power sources connected to the electrodes $M_1$, $M_2$, $M_3$ . . . $M_n$. The number $M_1$ to $M_n$ of the pumping electrodes is a limited number of the electrodes to be actually provided on the laminate.

When the number of the pumping electrodes and the values of the DC bias voltages as shown in FIG. 16 are applied to the device of FIG. 8, the frequency characteristic of the surface-acoustic-wave output signal $SAW_3$ becomes a desired one as shown in FIG. 17.

Figure 2:
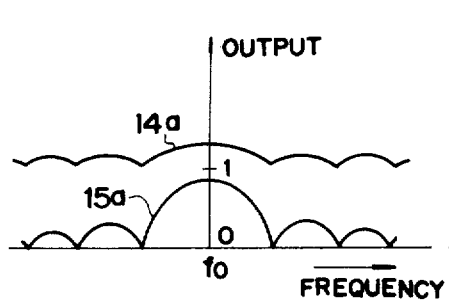
FIGS. 2 and 3 are characteristic curves of output frequency characteristics of the device shown in FIG. 1.
Figure 3:
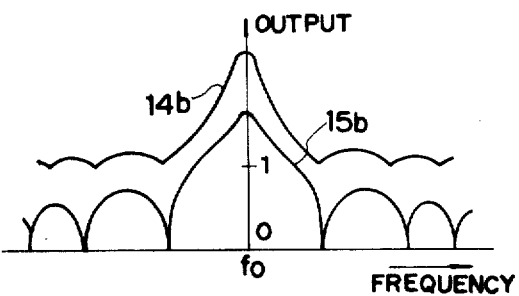

When this frequency characteristic $E_3$ is compared with the frequency characteristic $E_2$ of the ideal bandpass filter shown in FIG. 11, there can be seen deterioration in a knee characteristic of the filter, but the spurious response is markedly reduced as compared with that of the known device, shown in FIG. 2, to such an extent that it is negligible in a practical use.

Therefore the application mode of the DC bias voltages to the respective pumping electrodes $M_1$, $M_2$, $M_3$ . . . $M_n$ as shown in FIG. 16 is applicable as a DC bias voltage application mode to the surface acoustic wave parametric device providing the desired frequency characteristic $E_3$.

Figure 18:
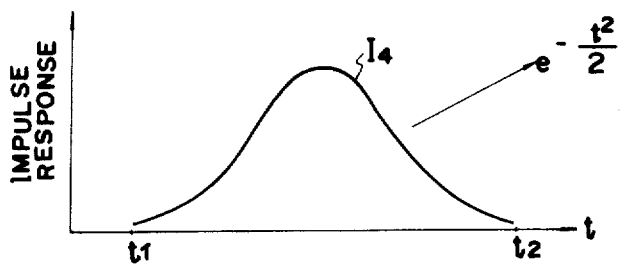
FIG. 18 is a characteristic curve showing another example of an impulse response applied to the present invention.
Figure 19:
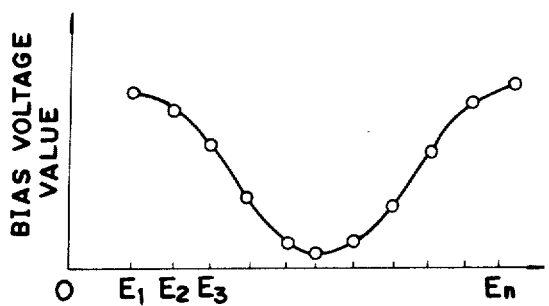
FIG. 19 is a curve showing another example of an arrangement of DC bias voltages to be applied to the respective pumping electrodes and corresponding to the impulse response of FIG. 18.

FIGS. 18 and 19 shows another design example of DC bias voltage values to be applied to respective pumping electrodes $M_1$, $M_2$, $M_3$ . . . . In this example, the desired frequency characteristic is in terms of the Gauss function $e^{-2\pi^2 f^2}$ and values of DC bias voltages to be applied to the respective pumping electrodes $M_1$, $M_2$, $M_3$ . . . $M_n$ are set so as to make the impulse response equal to time response $I_4$ in Fourier transform relation with the Gauss function.

In this example, as compared with the characteristic $E_2$ of the ideal bandpass filter, there can be recognized slight deterioration in the knee characteristic of the filter, but the spurious response is improved. In addition, the number of the pumping electrodes $M_1$, $M_2$ . . . can be selected within a practicable range. Thus, this example may be applicable as a mode for applying DC bias voltage to the surface-acoustic-wave parametric device of FIG. 8.

The foregoing two examples as shown in FIGS. 15 to 20 are examples when the pumping voltages are small. When the pumping voltage is large and the parametric interaction is large, setting of the impulse response and the DC bias voltage values to be applied to the respective pumping electrodes $M_1$, $M_2$ . . . are somewhat changed. If an effect of this change is taken into consideration, an application mode of DC bias voltage for obtaining the desired frequency characteristic can be selected in a manner similar to that as described above.

Although the foregoing examples have been described in connection with the case where a backward wave output indicated by $SAW_3$ in FIG. 8 is derived as a surface-acoustic-wave output, similar design can be applied to a case where a surface-acoustic-wave output $SAW_2$ in the same direction as of the input surface acoustic wave $SAW_1$ is derived as an output.

However, in the case of the surface acoustic wave $SAW_2$, a signal component having a frequency at which a parametric interaction is not caused is outputted as it is, without being subjected to modulation, and therefore an effect of improvement in spurious response is somewhat reduced.

The surface-acoustic-wave parametric device embodying the present invention is constructed as described above and will operate as follows.

Voltages set, for example, as shown in FIG. 16 are applied to the respective pumping electrodes $M_1$, $M_2$, $M_3$ . . . through the respective DC power sources $E_1$, $E_2$, $E_3$ . . . , to cause distribution of depletion-layer capacitances corresponding to the respective set voltage values on the surface of the semiconductor substrate 1 under the pumping electrodes $M_1$, $M_2$ . . . . In addition, a pumping voltage having a frequency 2fo twice that of a center frequency fo at the desired frequency selection band is applied to the pumping electrodes $M_1$, $M_2$, $M_3$ . . . from the high-frequency power source 9 to excite the depletion-layer capacitances as described above at the frequency 2fo and modulate the depletion-layer capacitances at the frequency 2fo.

On the other hand, an input electric signal applied to the wide-band input transducer 5 is converted to a surface acoustic wave and propagated at the surface of the piezoelectric layer 3 rightwardly and leftwardly as viewed in FIG. 8 from the input transducer 5.

In the course of rightward propagation of a signal component having a frequency around the frequency fo of the surface-acoustic-wave input signal $SAW_1$, through the parametric interaction regions beneath the respective pumping electrodes $M_1$, $M_2$, $M_3$ . . . , the piezoelectric potential is subjected to the parametric interaction with the pumping voltages by the depletion-layer capacitance non-linearity effect at the surface of the semiconductor substrate 1 and the component is amplified so as to produce an output surface acoustic wave from the pumping electrode portion M rightwardly and leftwardly as viewed in FIG. 8.

The output surface acoustic wave $SAW_2$ travelling in the same direction as the input surface acoustic wave $SAW_1$ is converted into an electric signal by the output transducer 6 and outputted to the outside.

The output surface acoustic wave $SAW_3$ travelling in the direction opposite to that of the input surface acoustic wave $SAW_1$ is derived outside as an electric signal using the input transducer 5 or another suitable means, e.g., an output means having a multi-strip coupler as disclosed in Japanese Application No. 54-64923 (1979).

Since a plurality of pumping electrodes are provided at the parametric interaction regions forming portion and DC bias voltages corresponding to the desired frequency characteristic are applied to the respective pumping electrodes $M_1$, $M_2$, $M_3$ . . . , only the signal components of the input surface acoustic wave $SAW_1$ which corresponds to the desired frequency characteristic are selectively outputted as the surface acoustic wave $SAW_2$ or $SAW_3$.

Figure 20:
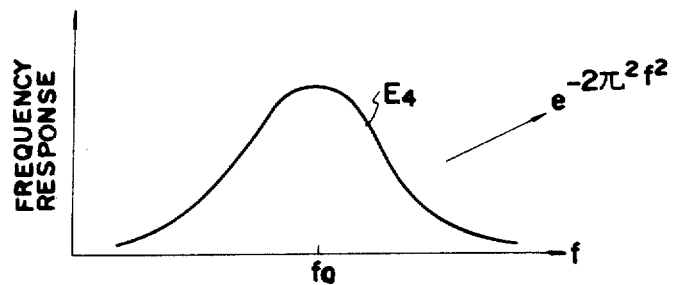
FIG. 20 is a characteristic curve showing an output frequency characteristic when the arrangement of FIG. 19 is applied to the device of FIG. 8.

For example, the output surface acoustic wave $SAW_3$ in the opposite direction to that of the input surface acoustic wave $SAW_1$ is outputted as a signal having the desired frequency characteristic as shown in FIGS. 17 or 20, and the surface-acoustic-wave parametric device functions as a desired bandpass filter.

As to the output surface acoustic wave $SAW_2$ in the same direction as that of the input surface acoustic wave $SAW_1$, it is somewhat inferior in spurious response to the output surface acoustic wave $SAW_3$, but it is also outputted as a signal having the desired frequency characteristic.

Although the DC bias voltages to be applied to the respective pumping electrodes are differentiated so as to correspond to the desired frequency characteristic, alternatively, the pumping voltages may be differentiated so as to correspond to the desired frequency characteristic.

Figure 21:
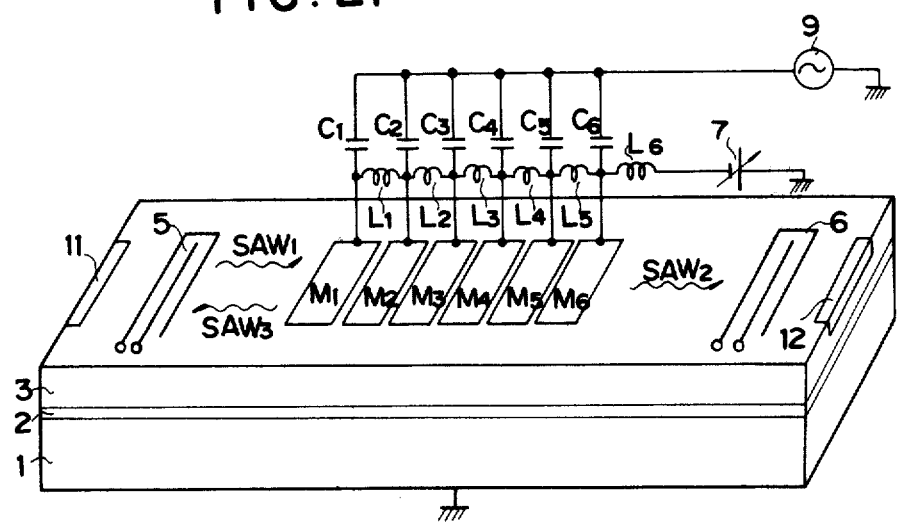
FIG. 21 is a view of another embodiment of a surface-acoustic-wave parametric device according to the present invention, showing a laminate thereof in perspective.

FIG. 21 illustrates another embodiment of the present invention which is based on this theory. Capacitors having different capacitances, respectively, are connected to pumping electrodes $M_1$, $M_2$ . . . . Opposite ends of the respective capacitors $C_1$, $C_2$ . . . are commonly connected to a high-frequency power source for applying a pumping voltage, i.e., a pumping power source 9.

Thus, high-frequency voltage drops at the respective capacitors $C_1$, $C_2$ . . . are differentiated so that pumping voltages of different values are applied to the respective pumping electrodes $M_1$, $M_2$ . . . .

The capacitors $C_1$, $C_2$ . . . also function as DC blocking capacitors, respectively.

Figure 22:
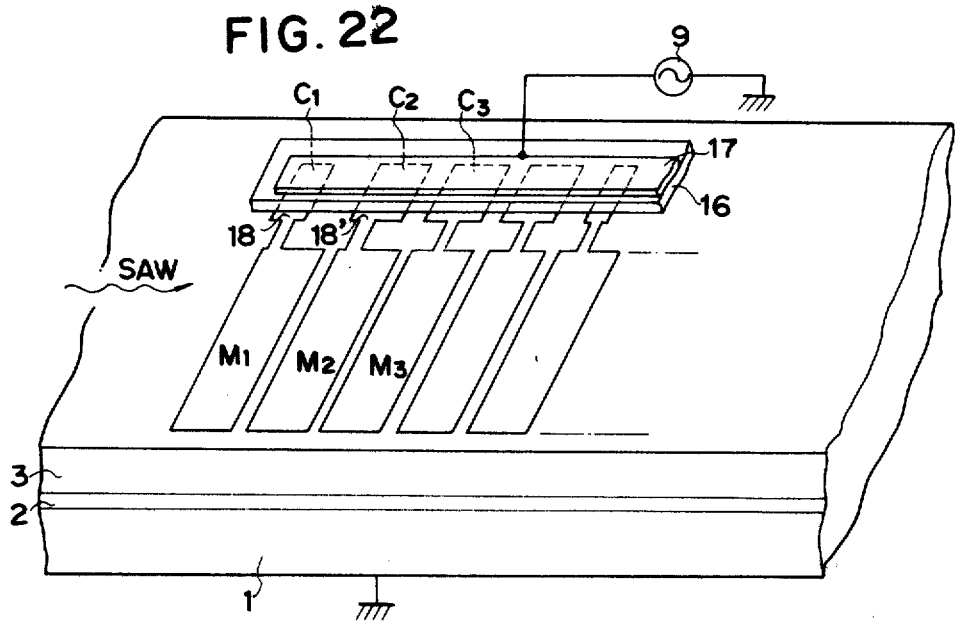
FIG. 22 is an enlarged perspective view, partially omitted, of a specific example of the device of FIG. 21 wherein capacitors are integrated on the laminate.

FIG. 22 is one example of specific arrangement of the capacitors $C_1$, $C_2$ . . . . In this example, each of the capacitors $C_1$, $C_2$ . . . is formed as a thin film capacitor, and the thin film capacitors are integrated on a piezoelectric layer 3, i.e., in the same plane as the pumping electrodes. In the figure, 16 is a thin film of an inductive layer, 17 is an upper electrode and 18, 18' . . . are lower electrodes. The areas of the respective lower electrodes 18, 18' . . . may be varied to differentiate the capacitances of the capacitors $C_1$, $C_2$ . . . .

The elements for regulating pumping voltages to be applied to the respective pumping electrodes $M_1$, $M_2$ . . . are not limited to capacitors, but may be impedance elements such as inductors L, or resistors R, etc. In the latter case, the capacitors $C_1$, $C_2$ . . . are used as capacitors for DC blocking and the inductors L or resistors R having different impedance values are connected in series with the respective capacitors $C_1$, $C_2$ . . . .

Procedures for designing the pumping voltage values to be applied to the parametric interaction regions forming portion, i.e., the pumping electrodes $M_1$, $M_2$ . . . will now be described.

The amplitude of a surface acoustic wave output signal produced by an impulse $e_1$ depends on the strength of the parametric interaction regions, and the strength of the parametric interaction is determined mainly by the magnitude of the pumping voltage. When other conditions are fixed, the strength of the parametric interaction is varied by varying the pumping voltage and the magnitude of the surface acoustic wave output signal $SAW_3$ produced by the impulse $e_1$.

When the magnitude of the impulse response is varied corresponding to the values of the pumping voltages to be applied to the respective pumping electrodes $M_1$, $M_2$ . . . in such a manner that the voltage of the pumping power source 9 is fixed and the capacitance values (impedance values) of the capacitors are varied as shown in FIG. 21, the impulse response is substantially in proportion to the square of the capacitance value of the capacitor if the pumping power source 9 and the pumping electrode are loosely coupled and the parametric interaction is relatively weak.

To equalize the time response $I_2$ with the impulse response, the capacitance values of the capacitors $C_1$, $C_2$ connected to the pumping electrodes $M_1$, $M_2$ . . . are differentiated so as to correspond to the waveform of the time response $I_2$.

Figure 23:
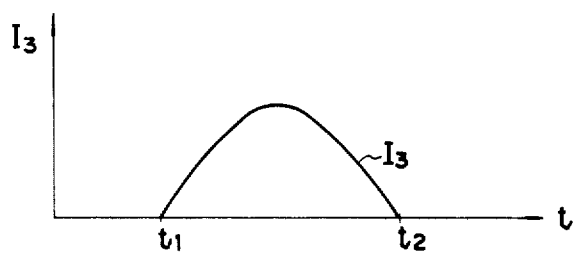
FIG. 23 is a characteristic curve showing an impulse response of the characteristic of FIG. 12 with the waveform portion other than $-\pi < x < \pi$ removed.
Figure 24:
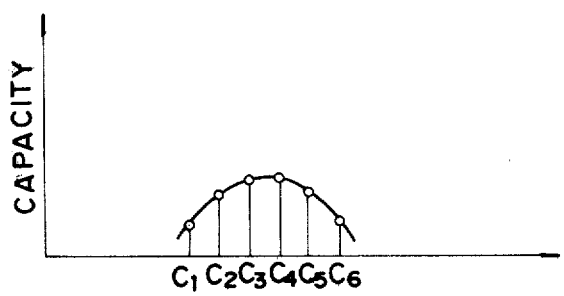
FIG. 24 is a curve showing an arrangement of capacitance values of respective capacitors corresponding to the impulse response of FIG. 23.
Figure 25:
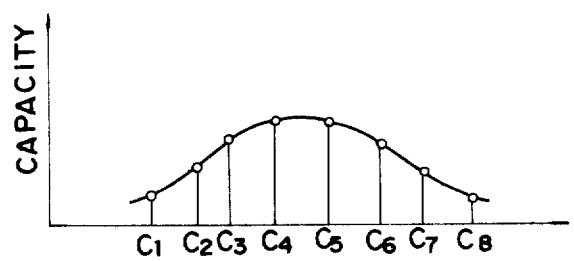
FIG. 25 is a similar curve showing another setting example of capacitance values of respective capacitors corresponding to another impulse response.

FIG. 23 shows an impulse response $I_3$ corresponding to the time response of sin x/x of FIG. 12 with a waveform portion other than that of $-\pi < x < \pi$ removed. The capacitance values of the respective capacitors $C_1$, $C_2$ . . . connected to the respective pumping electrodes $M_1$, $M_2$ . . . corresponding to the impulse response $I_3$ are as shown in FIG. 24. Although the number of the pumping electrodes provided is six in the case of FIG. 24, the number of the pumping electrodes preferably as large as possible so as to correspond to the impulse response more accurately.

When the number of the pumping electrodes and the capacitance values of the respective capacitors $C_1$, $C_2$ . . . as shown in FIG. 24 are applied to the device of FIG. 21, the surface-acoustic-wave output signal $SAW_3$ has the desired frequency characteristic as shown in FIG. 17.

As this frequency characteristic $E_3$ is compared with that of the ideal bandpass filter $E_2$ as shown in FIG. 11, there can be seen deterioration in the knee characteristic of the filter, but the spurious response is reduced to such an extent that it is neglegible in practical use as compared with that of the conventional device as shown in FIG. 2.

Therefore the setting mode of capacitance values of the respective capacitors $C_1$, $C_2$ . . . connected to the respective pumping electrodes $M_1$, $M_2$, $M_3$ . . . $M_n$ as shown in FIG. 24 is applicable as a capacitance value setting mode to the surface acoustic wave parametric device providing the desired frequency characteristic $E_3$.

FIG. 19 shows another design example for setting capacitance values of the capacitors $C_1$, $C_2$ . . . . In this example, the desired frequency characteristic is in terms of the Gauss function $e^{-2\pi^2 f^2}$ and set values of capacitances of the respective capacitors $C_1$, $C_2$ . . . so as to make the impulse response of FIG. 18 equal to time response $I_4$ which is in Fourier transform relation with the Gauss function.

In this example, as compared with the characteristic $E_2$ of the ideal bandpass filter, there can be recognized slight deterioration in the knee characteristic of the filter, but the spurious response is improved. In addition, the number of the pumping electrodes $M_1$, $M_2$ . . . can be selected within a practicable range. Thus, this example may be applicable as a pumping electrode for the surface-acoustic-wave parametric device of FIG. 21.

The foregoing two examples as shown in FIGS. 21 to 25 are examples when the parametric interaction is relatively weak. When the parametric interaction is strong, setting of the impulse response and the capacitance values of the respective capacitors $C_1, C_2 \ldots$ are somewhat changed. If an effect of this change is taken into consideration, setting of the capacitance values of the respective capacitors for obtaining the desired frequency characteristic can be attained in a manner similar to that as described above.

The surface-acoustic-wave parametric device of FIG. 21 embodying the present invention is constructed as described above and will operate as follows:

DC bias voltages are applied to the respective pumping electrodes $M_1, M_2, M_3 \ldots$ from a DC power source 7, to create suitable depletion-layer capacitance on the surface of the semiconductor substrate 1 under the pumping electrodes $M_1, M_2 \ldots$. In addition, a pumping voltage having a frequency 2fo twice that of a center frequency fo at the desired frequency selection band is applied to the pumping electrodes $M_1, M_2, M_3 \ldots$ from the high-frequency power source 9 to excite the depletion-layer capacitances as described above at the frequency 2fo and modulate the depletion-layer capacitances at the frequency 2fo.

On the other hand, an input electric signal applied to the wide-band input transducer 5 is converted to a surface acoustic wave and propagated at the surface of the piezoelectric layer 3 rightwardly and leftwardly as viewed in FIG. 21 from the input transducer 5.

In the course of rightward propagation of a signal component having a frequency around the frequency fo of the surface-acoustic-wave input signal $SAW_1$, through the parametric interaction regions beneath the respective pumping electrodes $M_1, M_2, M_3 \ldots$, the piezoelectric potential is subjected to the parametric interaction with the pumping voltages by the depletion-layer capacitance non-linearity effect at the surface of the semiconductor substrate 1 and the component is amplified so as to produce an output surface acoustic wave from the pumping electrode portion M rightwardly and leftwardly as viewed in FIG. 21.

Since a plurality of pumping electrodes are provided at the parametric interaction regions forming portion and capacitance values of the respective capacitances connected to the pumping electrodes $M_1, M_2 \ldots$ are set so that pumping voltages corresponding to the desired frequency characteristic are applied to the respective pumping electrodes $M_1, M_2, M_3 \ldots$, only the signal components of the input surface acoustic wave $SAW_1$ which correspond to the desired frequency characteristic are selectively outputted as the surface acoustic wave $SAW_2$ or $SAW_3$.

For example, the output surface acoustic wave $SAW_3$ in the opposite direction to that of the input surface acoustic wave $SAW_1$ is outputted as a signal having the desired frequency characteristic as shown in FIGS. 17 or 20, and the surface-acoustic-wave parametric device functions as a desired bandpass filter.

As described above, in accordance with the present invention, a plurality of pumping electrodes are arranged in the propagation direction of a surface acoustic wave and DC bias voltages or pumping voltages are differentiated so as to correspond to a desired frequency characteristic of the output surface acoustic wave.

Therefore, when this surface-acoustic-wave parametric device is used as a variable frequency selecting device (a bandpass filter), it is very advantageous that it can be designed so as to conform with any desired output frequency characteristic.

In addition to the advantage as described above, the surface-acoustic-wave parametric device of the present invention has the advantages that a surface-acoustic-wave device generally has. For example, the device has a variable tuning characteristic over a wide frequency range, the stability of the output center frequency can be determined by the stability of an external pumping power source, and the S/N ratio is excellent.

The embodiments of the invention in which an exclusive property or privilege is claimed are defined as follows:

1. A surface-acoustic-wave parametric device which comprises:
   a laminate which includes a semiconductor layer and a piezoelectric layer;
   means for propagating a surface acoustic wave along a path in said laminate;
   a plurality of spaced pumping electrodes provided along said surface-acoustic-wave propagating path in said laminate;
   means for applying pumping voltages to said pumping electrodes; and
   means for applying DC bias voltages of different, predetermined values to respective said pumping electrodes, said DC bias voltage values being selected so that an output frequency characteristic of said device corresponds to the impulse response thereof.

2. A surface-acoustic-wave parametric device which comprises:
   a laminate which includes a semiconductor layer and a piezoelectric layer;
   means for propagating a surface acoustic wave along a path in said laminate;
   a plurality of spaced pumping electrodes provided along said surface-acoustic-wave propagating path in said laminate;
   means for applying DC bias voltages to said pumping electrodes; and
   means for applying AC pumping voltages of different, predetermined values to respective said pumping electrodes, said predetermined pumping voltage values being selected so that an output frequency characteristic of said device corresponds to the impulse response thereof.

3. A surface-acoustic-wave parametric device according to claim 1 or claim 2, wherein said pumping electrodes are each rectangular and are arranged with the long sides thereof parallel with each other.

4. A surface-acoustic-wave parametric device according to claim 1, wherein said means for applying DC bias voltages includes a plurality of DC power sources, said DC power sources being connected to respective said pumping electrodes.

5. A surface-acoustic-wave parametric device according to claim 1, wherein said means for applying DC bias voltages includes a DC power source and a plurality of voltage regulating means, said DC power source being connected to each said pumping electrode by a respective said voltge regulating means.

6. A surface-acoustic-wave parametric device according to claim 5, wherein each said voltage regulating means is a film resistor integrated on a common plane with said pumping electrodes.

7. A surface-acoustic-wave parametric device according to claim 2, wherein said means for applying pumping voltages includes a plurality of pumping power sources connected to respective said pumping electrodes.

8. A surface-acoustic-wave parametric device according to claim 2, wherein said means for applying pumping voltages includes at least one pumping power source and a plurality of impedance circuits having different impedance values, said pumping power source being connected to each said pumping electrode by a respective said impedance circuit.

9. A surface-acoustic-wave parametric device according to claim 8, wherein said impedance circuits are capacitors having different capacitance values.

10. A surface-acoustic-wave parametric device according to claim 9, wherein said capacitors are thin film capacitors integrated on a common plane with said pumping electrodes.

11. A surface-acoustic-wave parametric device according to claim 1 or claim 2, wherein said means for propagating a surface-acoustic-wave includes spaced input and output transducers, said pumping electrodes being located between said transducers.

12. A surface-acoustic-wave parametric device according to claim 1 or claim 2, wherein said means for propagating a surface acoustic wave includes means for inputting a surface acoustic wave into said laminate and means for deriving an output surface acoustic wave from said laminate, said means for deriving an output surface acoustic wave being adapted to derive a surface acoustic wave which is produced by said inputted surface acoustic wave, which has a frequency corresponding to a band-pass portion of said frequency characteristic and which travels in a direction opposite to said input surface acoustic wave.

13. A surface-acoustic-wave device according to claim 9, wherein said capacitors also block direct current.

14. A surface-acoustic-wave device according to claim 1 or claim 2, wherein said semiconductor layer is made of silicon and said piezoelectric layer is one of zinc oxide and aluminum nitride.

15. A surface-acoustic-wave parametric device according to claim 1 or claim 2, which further comprises an insulating film interposed between said semiconductor layer and said piezoelectric layer for passivating the surface of said semiconductor layer, said insulating film being made of silicon dioxide.

16. The surface-acoustic-wave parametric device according to claim 1, wherein said DC bias voltages applied to said pumping electrodes decrease successively from the outermost pumping electrodes toward the central pumping electrodes.

17. The surface-acoustic-wave parametric device according to claim 2, wherein said AC pumping voltages applied to said pumping electrodes increase successively from the outermost pumping electrodes to the central pumping electrodes.

18. A method of adjusting the frequency response of a surface-acoustic-wave device which includes a laminate having a semiconductor layer and a piezoelectric layer, means for propagating a surface acoustic wave along a path in said laminate, and a plurality of spaced pumping electrodes provided along said path, comprising the steps of applying an AC pumping voltage to each said pumping electrode, applying a respective DC bias voltage to each said pumping electrode, and selecting said DC bias voltages so that an output frequency characteristic of said device is approximately equivalent to the impulse response thereof.

19. A method of adjusting the frequency response of a surface-acoustic-wave device which includes a laminate having a semiconductor layer and a piezoelectric layer, means for propagating a surface acoustic wave along a path in said laminate, and a plurality of spaced pumping electrodes provided along said path, comprising the steps of applying a DC bias voltage to each said pumping electrode, applying a respective AC pumping voltage to each said pumping electrode, and selecting said AC pumping voltages so that an output frequency characteristic of said device is approximately equivalent to the impulse response thereof.

* * * * *